US012604517B2

(12) United States Patent     (10) Patent No.:   US 12,604,517 B2

Kumada             (45) Date of Patent:     Apr. 14, 2026

(54) SEMICONDUCTOR DEVICE

(71) Applicant: FUJI ELECTRIC CO., LTD.,
Kawasaki (JP)

(72) Inventor: Keishirou Kumada, Matsumoto-city
(JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 275 days.

(21) Appl. No.: 18/326,319

(22) Filed: May 31, 2023

(65) Prior Publication Data

US 2024/0021605 A1     Jan. 18, 2024

(30) Foreign Application Priority Data

Jul. 13, 2022    (JP) ................................. 2022-112157

(51) Int. Cl.
    *H01L 27/06*       (2006.01)
    *H10D 8/00*        (2025.01)
              (Continued)

(52) U.S. Cl.
    CPC ........... *H10D 84/617* (2025.01); *H10D 8/422*
       (2025.01); *H10D 12/481* (2025.01);
              (Continued)

(58) Field of Classification Search
    CPC .... H10D 84/617; H10D 8/422; H10D 12/481;
             H10D 62/109; H10D 62/127; H10D
                                  62/393
    See application file for complete search history.

(56) References Cited

U.S. PATENT DOCUMENTS

| | | | |
|---|---|---|---|
| 2011/0227069 A1 | 9/2011 | Hashimoto | |
| 2014/0167797 A1* | 6/2014 | Aerts | G05F 1/573 |
| | | | 324/750.3 |

(Continued)

FOREIGN PATENT DOCUMENTS

| | | |
|---|---|---|
| JP | 2011198891 A | 10/2011 |
| JP | 2018026472 A | 2/2018 |

(Continued)

OTHER PUBLICATIONS

Office Action issued for Japanese Patent Application No. 2022-112157, and its machine translation, dated Mar. 3, 2026.

*Primary Examiner* — Jarrett J Stark
(74) *Attorney, Agent, or Firm* — Rabin & Berdo, P.C.

(57)            ABSTRACT

A semiconductor device includes a main semiconductor region and a current detecting region. The main semiconductor region and the current detecting region have a semiconductor substrate of a first conductivity type, a first semiconductor layer of a first conductivity type, first semiconductor regions of a second conductivity type, second semiconductor regions of the first conductivity type, trenches, first high-concentration regions of the second conductivity type, and second high-concentration regions of the second conductivity type. An active region through which a current flows when the current detecting region is in an on-state has a first cell region that operates as a transistor and second cell regions that are provided, respectively, in four corners of the first cell region and operate only as diodes and not as a transistor.

10 Claims, 11 Drawing Sheets

(51) Int. Cl.

| | |
|---|---|
| *H10D 12/00* | (2025.01) |
| *H10D 62/10* | (2025.01) |
| *H10D 62/17* | (2025.01) |
| *H10D 84/60* | (2025.01) |

(52) U.S. Cl.

CPC ......... *H10D 62/109* (2025.01); *H10D 62/127* (2025.01); *H10D 62/393* (2025.01)

(56) References Cited

U.S. PATENT DOCUMENTS

| | | | |
|---|---|---|---|
| 2018/0047721 A1 | 2/2018 | Nishimura | |
| 2019/0341484 A1 | 11/2019 | Takeuchi et al. | |
| 2020/0020797 A1* | 1/2020 | Suzuki | H10D 62/107 |
| 2020/0126962 A1* | 4/2020 | Kono | H01L 25/18 |
| 2020/0395456 A1* | 12/2020 | Hoshi | H10D 30/669 |
| 2020/0411643 A1* | 12/2020 | Hoshi | H10D 62/393 |
| 2021/0074845 A1* | 3/2021 | Hoshi | H01L 23/49 |
| 2021/0083105 A1* | 3/2021 | Hoshi | H10D 84/143 |
| 2021/0091220 A1* | 3/2021 | Sugawara | H03K 17/687 |
| 2021/0175353 A1* | 6/2021 | Hoshi | H10D 62/127 |
| 2021/0359128 A1* | 11/2021 | Hoshi | H10D 62/8325 |
| 2021/0384298 A1* | 12/2021 | Hoshi | H10D 30/669 |
| 2022/0069072 A1 | 3/2022 | Hoshi | |
| 2022/0077312 A1 | 3/2022 | Hoshi | |
| 2022/0165629 A1* | 5/2022 | Utsumi | H10D 62/109 |
| 2023/0062475 A1* | 3/2023 | Kumada | H10D 30/668 |
| 2023/0139229 A1 | 5/2023 | Kawahara et al. | |
| 2024/0021723 A1* | 1/2024 | Moriya | H10D 62/127 |
| 2024/0222436 A1* | 7/2024 | Tsuji | H10D 84/811 |

FOREIGN PATENT DOCUMENTS

| | | | |
|---|---|---|---|
| JP | 6696450 | B2 | 5/2020 |
| JP | 6962511 | B1 | 11/2021 |
| JP | 2022042526 | A | 3/2022 |
| JP | 2022044997 | A | 3/2022 |

* cited by examiner

SEMICONDUCTOR DEVICE

CROSS REFERENCE TO RELATED APPLICATIONS

This application is based upon and claims the benefit of priority of the prior Japanese Patent Application No. 2022-112157, filed on Jul. 13, 2022, the entire contents of which are incorporated herein by reference.

BACKGROUND OF THE INVENTION

1. Field of the Invention

Embodiments of the invention relate to a semiconductor device.

2. Description of the Related Art

To improve reliability, high functioning semiconductor devices with added protective functions have been proposed that integrate a current sensing portion, a temperature sensing portion, etc. into a metal oxide semiconductor field effect transistor (MOSFET), an insulated gate bipolar transistor (IGBT), or the like.

FIG. 13 is a top view depicting a structure of a conventional semiconductor device. In a semiconductor device 150, a main semiconductor device 146 is provided in an effective region (region functioning as a MOS gate) of an active region 140. The effective region of the active region 140 is a region through which a main current flows when the main semiconductor device 146 is on. In the effective region of the active region 140, contact electrodes 112 of the main semiconductor device 146 (refer to FIGS. 14 and 15) are provided on a front surface of a semiconductor substrate. The contact electrodes 112, for example, cover substantially an entire surface of the effective region of the active region 140. Further, on front surfaces of the contact electrodes 112, for example, a source electrode pad (not depicted) having a rectangular shape in a plan view of the device is provided.

An edge termination region 141 is a region between the active region 140 and a chip (semiconductor substrate) side surface and is for mitigating electric field of a front side of the semiconductor substrate and sustaining a breakdown voltage (withstanding voltage). In the edge termination region 141, for example, a voltage withstanding structure (not depicted) such as a p-type region configuring a junction termination extension (JTE) structure, a guard ring, a field plate, RESURF, etc. is disposed.

Further, in the active region 140, a high functioning region 145 is provided adjacent to the active region 140. The high functioning region 145, for example, has a substantially rectangular shape in the plan view. In the high functioning region 145, a high functioning portion such as a current sensing portion 142, an overvoltage protecting portion (not depicted), an arithmetic circuit portion (not depicted), and the like is provided. In FIG. 13, while only the current sensing portion 142 is depicted as a high functioning portion, other high functioning portions other than the current sensing portion 142 may be disposed in the high functioning region 145.

The current sensing portion 142 has a function of detecting overcurrent (OC) flowing in the main semiconductor device 146. The current sensing portion 142 is a vertical MOSFET having several unit cells (functional units of a device) each having a same configuration as that of the main semiconductor device 146, in an active region of the current sensing portion 142.

The structure of the conventional semiconductor device is described taking a trench-type vertical MOSFET as an example. FIG. 14 is an enlarged view of regions S1, S2 of the conventional semiconductor device in FIG. 13. FIG. 15 is a cross-sectional view along cutting line A-A' in FIG. 14, which depicts the structure of the conventional semiconductor device.

A semiconductor base substrate 120 is formed by epitaxially growing an n-type silicon carbide epitaxial layer 102 on an $n^+$-type starting substrate (an $n^+$-type semiconductor substrate 101) that contains silicon carbide (SiC) and thereafter, forming a p-type base layer 106 by ion implantation or epitaxial growth. In the active region 140 of the current sensing portion 142 and the active region 140 of the main semiconductor device 146, first $p^+$-type base regions 103 are selectively provided in the n-type silicon carbide epitaxial layer 102 so as to underlie an entire area of each bottom of multiple trenches 116. In the n-type silicon carbide epitaxial layer 102, at a first surface thereof opposite to a second surface thereof facing the $n^+$-type silicon carbide substrate 101, second $p^+$-type base regions 104 are selectively provided.

Further, in the active region 140 of the conventional semiconductor device 150, $n^+$-type source regions 107, $p^+$-type contact regions 108, the trenches 116, gate insulating films 117, and gate electrodes 110 are further provided in the semiconductor base substrate 120. At a front side of the semiconductor base substrate 120, an interlayer insulating film 111, the contact electrodes 112, and the source electrode pad (not depicted) are provided while at a back side of the semiconductor base substrate 120, a back electrode 113 and a drain electrode pad (not depicted) are provided. The contact electrodes 112 are provided on the $n^-$-type source regions 107 and the $p^+$-type contact regions 108. In FIG. 14, the contact electrodes 112 are depicted smaller than in actuality to show the $n^+$-type source regions 107 and the $p^+$-type contact regions 108.

The edge termination region 141 of the current sensing portion 142 and the edge termination region 141 of the main semiconductor device 146 are free of the MOS structure configured by the trenches 116, the $n^+$-type source regions 107, the gate insulating films 117, and the gate electrodes 110 and in the edge termination regions 141, the first $p^+$-type base regions 103 are provided in the n-type silicon carbide epitaxial layer 102 and the $p^+$-type contact regions 108 are provided in the first $p^+$-type base regions 103, at the surfaces thereof.

Further, to suppress poor mitigation of electric field and decreases in the breakdown voltage and to suppress crystal damage due to occurrences of leakage, a commonly known SiC semiconductor device has a device separating layer so that main cell regions and sensing cell regions are electrically separated from each other and an electric field mitigating layer so that electric field concentration at a bottom of the device separating layer is mitigated (for example, refer to Japanese Patent No. 6696450).

Further, a commonly known semiconductor device detects operating current of a MOSFET and diode current and has a main current region through which a main current flows and a current sensing region through which a current flows that is smaller than the main current (for example, refer to Japanese Laid-Open Patent Publication No. 2011-198891).

Further, in a commonly known semiconductor device, a trench has a sidewall that faces a main SBD region, and from the sidewall, a bottom of the trench is surrounded by p-type regions including first and second p-type regions provided in a main SBD region and a first p⁺-type region surrounding the bottom of the trench, whereby during SBD operation of the main SBD region, electric field applied to the trench, at a bottom corner portion thereof facing the main SBD region is mitigated (for example, refer to Japanese Laid-Open Patent Publication No. 2022-042526).

SUMMARY OF THE INVENTION

According to an embodiment of the invention, a semiconductor device includes: a main semiconductor region through which a main current flows during an on-state of the device, the main semiconductor region being configured by a first structure; and a current detecting region having an active region through which another current different from the main current flows during the on-state, the current detecting region being configured by a second structure. Each of the first structure and the second structure has: a semiconductor substrate of a first conductivity type, the semiconductor substrate having a first main surface and a second main surface that are opposite to each other; a first semiconductor layer of the first conductivity type, provided at the first main surface of the semiconductor substrate, the first semiconductor layer having an impurity concentration that is lower than an impurity concentration of the semiconductor substrate, the first semiconductor layer having a first surface and a second surface that are opposite to each other, the second surface facing the semiconductor substrate; a second semiconductor layer of a second conductivity type, provided at the first surface of the first semiconductor layer, the second semiconductor layer having a first surface and a second surface that are opposite to each other, the second surface facing the semiconductor substrate; a plurality of first semiconductor regions of the second conductivity type, selectively provided in the second semiconductor layer, at the first surface of the second semiconductor layer, each of the plurality of first semiconductor regions having an impurity concentration that is higher than an impurity concentration of the second semiconductor layer; a plurality of trenches penetrating, respectively, through the second semiconductor layer and reaching the first semiconductor layer; a plurality of gate electrodes provided, respectively, in the plurality of trenches, via a plurality of insulating films, respectively; a plurality of first high-concentration regions of the second conductivity type, provided in the first semiconductor layer and facing the plurality of trenches, respectively, in a depth direction of the device; a plurality of second high-concentration regions of the second conductivity type, each provided between an adjacent two of the plurality of trenches in the first semiconductor layer and the second semiconductor layer and connected to the plurality of first semiconductor regions; a plurality of first electrodes electrically connected to the second semiconductor layer and the plurality of second semiconductor regions; and a second electrode provided at the second main surface of the semiconductor substrate. The first structure further has a plurality of second semiconductor regions of the first conductivity type selectively provided in the second semiconductor layer, at the first surface of the second semiconductor layer, the plurality of trenches further penetrating, respectively, through the plurality of second semiconductor regions, each of the plurality of first electrodes being further electrically connected to a corresponding one of the plurality of second semiconductor regions. The active region of the current detecting region has four corners, and includes: a first cell region operating as a transistor, and a plurality of second cell regions provided at respective ones of the four corners of the active region, and each operating as only a diode and not the transistor.

Objects, features, and advantages of the present invention are specifically set forth in or will become apparent from the following detailed description of the invention when read in conjunction with the accompanying drawings.

DETAILED DESCRIPTION OF THE INVENTION

Figure 14:
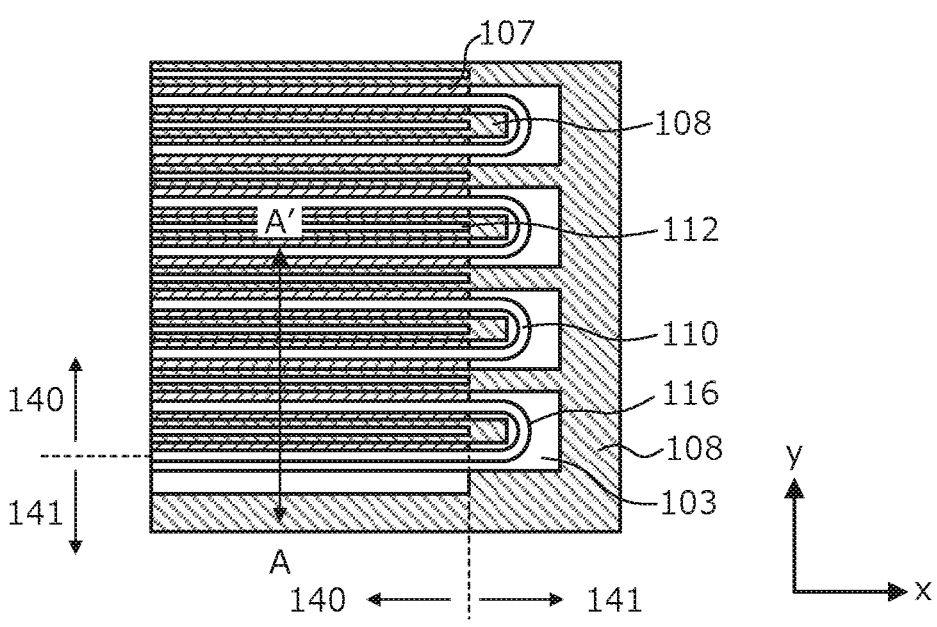
FIG. 14 is an enlarged view of regions S1, S2 of the conventional semiconductor device in FIG. 13.
Figure 15:
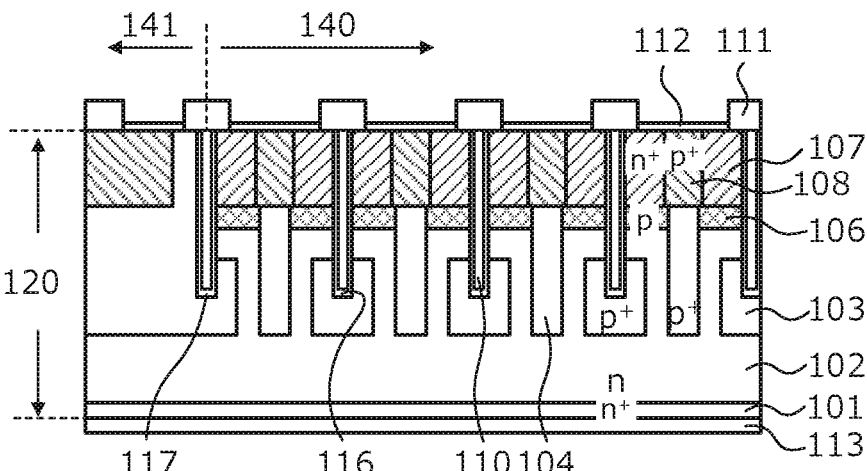
FIG. 15 is a cross-sectional view along cutting line A-A' in FIG. 14, which depicts the structure of the conventional semiconductor device.

First, problems associated with the conventional techniques are discussed. As depicted in FIGS. 14 and 15, the active region 140 of the current sensing portion 142 is structured similarly to the active region 140 of the main semiconductor device 146, simply, the active region 140 of the current sensing portion 142 has the structure of the active region 140 of the main semiconductor device 146 but of a smaller area. Further, the main semiconductor device 146 and the current sensing portion 142 have therein a parasitic diode (hereinafter, built-in diode) configured by pn junctions between the p-type base layer 106, the p$^+$-type contact regions 108, and the n-type silicon carbide epitaxial layer 102.

Thus, in an instance of a semiconductor device containing SiC, the built-in diode has a problem in that, during reverse recovery operation from a forward conducting state, current resulting inadvertently from the built-in diode concentrates in the current sensing portion 142 and the active region 140 of the current sensing portion 142 is destroyed.

Embodiments of a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

Figure 1:
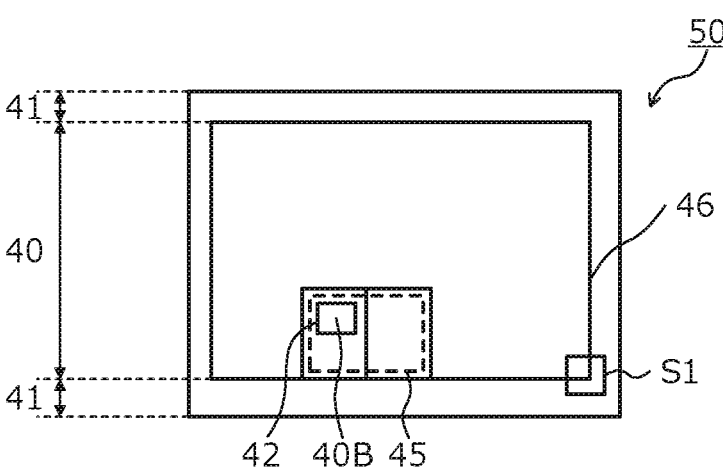
FIG. 1 is a top view depicting a structure of a semiconductor device according to a first embodiment.

A semiconductor device according to a first embodiment is configured using, as a semiconductor material, a semiconductor having a band gap that is wider than that of silicon (Si) (wide band gap semiconductor). A structure of the semiconductor device according to the first embodiment is described taking an instance in which, for example, silicon carbide (SiC) is used as the wide band gap semiconductor. FIG. 1 is a top view depicting the structure of the semiconductor device according to the first embodiment.

A semiconductor device 50 according to the first embodiment depicted in FIG. 1 has, in an active region 40 of a single semiconductor substrate (semiconductor chip), a main semiconductor device 46 and one or more circuit portions for protecting and controlling the main semiconductor device 46. The main semiconductor device 46 is a vertical MOSFET through which drift current flows in a depth direction of the semiconductor substrate in an on-state. The main semiconductor device 46 is configured by multiple unit cells (functional units of the device).

The unit cells of the main semiconductor device 46 are disposed adjacently in a direction parallel to the front surface of the semiconductor substrate. The main semiconductor device 46 performs a main operation of the semiconductor device 50 according to the first embodiment. The main semiconductor device 46 is disposed in a main effective region. The main effective region is a location where the main semiconductor device 46 is disposed in the active region 40. The main semiconductor device 46 is a region through which a main current flows when the main semiconductor device 46 is on. The main effective region, for example, has a substantially concave shape in a plan view of the device and occupies a large portion of the surface area of the active region 40.

A circuit portion for protecting and controlling the main semiconductor device 46 is a high functioning region 45 such as, for example, a current sensing portion 42, a temperature sensing portion (not depicted), an overvoltage protecting portion (not depicted), an arithmetic circuit portion (not depicted), etc. and is disposed in a main non-operating region of the active region 40. The main non-operating region is a region that is free of unit cells of the main semiconductor device 46 and that does not function as the main semiconductor device 46. The main non-operating region, for example, has a substantially rectangular shape in the plan view and is disposed between the main effective region and an edge termination region 41.

The edge termination region 41 is a region between the active region 40 and an end of the semiconductor substrate, surrounds a periphery of the active region 4, mitigates electric field of the front side of the semiconductor substrate, and sustains a breakdown voltage. In the edge termination region 41, for example, a voltage withstanding structure (not depicted) such as a p-type region configuring a junction termination extension structure, a field limiting ring, a field plate, a RESURF, etc. is disposed. The breakdown voltage is a voltage limit at which no malfunction or destruction of the device occurs.

The current sensing portion 42 operates under the same conditions as that of the main semiconductor device 46 and has a function of detecting overcurrent (OC) flowing in the main semiconductor device 46. The current sensing portion 42 is disposed apart from the main semiconductor device 46. The current sensing portion 42 is a vertical MOSFET that has a fewer number of unit cells (for example, about 10,000) than the main semiconductor device 46; each of the unit cells has a structure (second structure) same as a structure (first structure) of the main semiconductor device 46 or at least most of elements in the first and second structures are identical to each other; and the current sensing portion 42 has a smaller surface area than that of the main semiconductor device 46.

Figure 2:
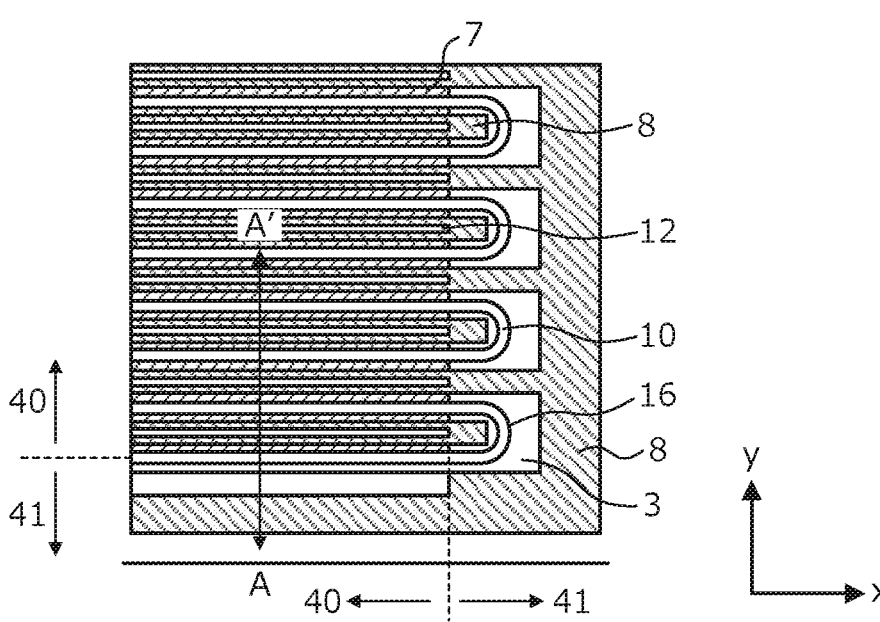
FIG. 2 is an enlarged top view of a region S1 of the semiconductor device according to the first embodiment depicted in FIG. 1.
Figure 3:
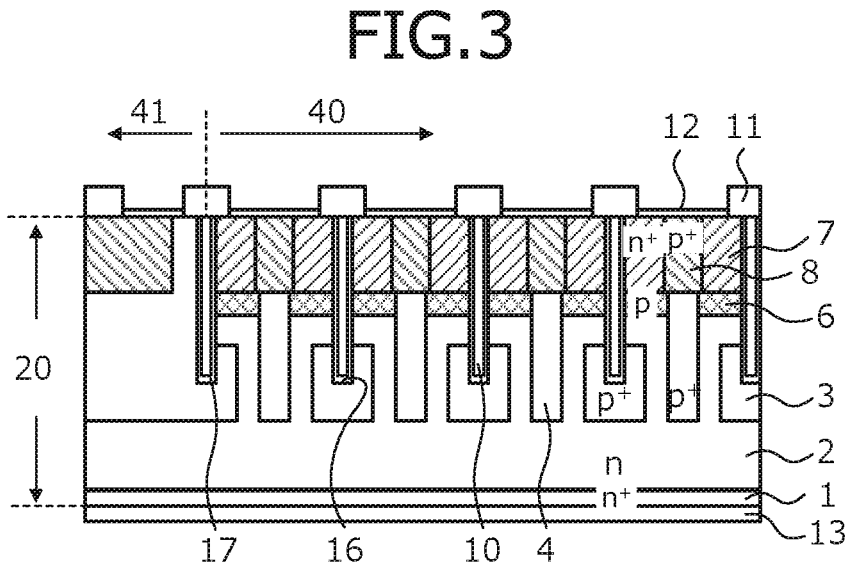
FIG. 3 is a cross-sectional view along cutting line A-A' in FIG. 2, which depicts the structure of the semiconductor device according to the first embodiment.

Next, a structure of the main semiconductor device 46 of the semiconductor device 50 according to the first embodiment is described. FIG. 2 is an enlarged top view of a region S1 of the semiconductor device according to the first embodiment depicted in FIG. 1. FIG. 3 is a cross-sectional view along cutting line A-A' in FIG. 2, which depicts the structure of the semiconductor device according to the first embodiment.

In FIGS. 2 and 3, while only a portion of the unit cells of the main semiconductor device 46 are depicted, all the unit cells of the main semiconductor device 46 have the same structure. The main semiconductor device 46 is a vertical MOSFET that has, in the main effective region, a MOS gate, which is an insulated gate having a three-layer structure including a metal, an oxide film, and a semiconductor, provided in the semiconductor substrate, at the front side thereof.

A semiconductor base substrate 20 is an epitaxial substrate in which an n-type silicon carbide epitaxial layer (first semiconductor layer of a first conductivity type) 2 and a p-type base layer (second semiconductor layer of a second conductivity type) 6 are sequentially formed by epitaxial growth on an n$^+$-type starting substrate (n$^+$-type semiconductor substrate 1: semiconductor substrate of the first conductivity type) containing silicon carbide. The main semiconductor device 46 has a general MOS gate configured by the p-type base layer 6, n$^+$-type source regions (second semiconductor regions of the first conductivity type) 7, p$^+$-type contact regions (first semiconductor regions of the second conductivity type) 8, trenches 16, gate insulating films 17, and gate electrodes 10 provided in the semiconductor base substrate 20, at the front side thereof. Further, the current sensing portion 42 is configured by the second structure having the p-type base layer 6, p$^+$-type contact regions 8, trenches 16, gate insulating films 17, and gate electrodes 10 provided in the semiconductor base substrate 20, at the front side thereof. The second structure may further have $n^+$-type source regions 7 as explained later.

The trenches 16 penetrate through the p-type base layer 6 in the depth direction (direction from contact electrodes (first electrodes) 12 to a back electrode (second electrode) 13) from a front surface of the semiconductor base substrate 20 and reach the n-type silicon carbide epitaxial layer 2. The trenches 16, for example, as depicted in FIG. 2, are disposed in a striped pattern extending in a direction parallel to a front surface of the $n^+$-type semiconductor substrate 1.

In the trenches 16, the gate electrodes 10 are provided via the gate insulating films 17. Between the trenches 16 (in a mesa region) adjacent to one another, the p-type base layer 6, the $n^+$-type source regions 7, and the $p^+$-type contact regions 8 are each selectively provided. The $n^+$-type source regions 7 and the $p^+$-type contact regions 8 are provided between the front surface of the semiconductor base substrate and the p-type base layer 6.

The $n^+$-type source regions 7 are provided closer to the trenches 16 than are the $p^+$-type contact regions 8. The $p^+$-type contact regions 8 may be omitted. In an instance in which the $p^+$-type contact regions 8 are omitted, at locations farther from the trenches 16 than are the $n^+$-type source regions 7, portions of the p-type base layer 6 reach the front surface of the semiconductor base substrate and are exposed at the front surface of the semiconductor base substrate 20.

Further, in the semiconductor base substrate 20, first $p^+$-type base regions (first high-concentration regions of the second conductivity type) 3 and second $p^+$-type base regions (second high-concentration regions of the second conductivity type) 4 are provided in the n-type silicon carbide epitaxial layer 2. The first $p^+$-type base regions 3 are provided apart from the p-type base layer 6 and face the trenches 16 in the depth direction. The first $p^+$-type base regions 3 are partially connected to the second $p^+$-type base regions 4. FIG. 3 depicts a cross-section of a portion where the first $p^+$-type base regions 3 and the second $p^+$-type base regions 4 are not connected.

In the mesa regions, the second $p^+$-type base regions 4 are provided apart from the first $p^+$-type base regions 3 and the trenches 16 and are in contact with the p-type base layer 6. The first $p^+$-type base regions 3 and the second $p^+$-type base regions 4 are fixed to a source potential of the main semiconductor device 46 via the p-type base layer 6. The first $p^+$-type base regions 3 and the second $p^+$-type base regions 4 have a function of mitigating electric field applied to the bottoms of the trenches 16.

An interlayer insulating film 11 is provided in an entire area of the front surface of the semiconductor base substrate 20 and covers the gate electrodes 10. The $n^+$-type source regions 7 and the $p^+$-type contact regions 8 of the main semiconductor device 46 are exposed in contact holes that penetrate through the interlayer insulating film 11 in the depth direction and reach the semiconductor base substrate 20. In the contact holes, the contact electrodes 12 are provided on the front surface of the semiconductor base substrate 20. In FIG. 2, the contact electrodes 12 are depicted narrower than in actuality to show the $n^+$-type source regions 7 and the $p^+$-type contact regions 8 (similarly in FIGS. 4, 6, 8, 11 described hereinafter).

The back electrode 13 constituting a drain electrode is in ohmic contact with an entire area of the back surface (back surface of the $n^+$-type starting substrate) of the semiconductor base substrate 20. On the back electrode 13, a drain pad (electrode pad, not depicted) is provided and has a stacked structure including, for example, a Ti film, a nickel (Ni) film, and a gold (Au) film sequentially stacked.

Figure 4:
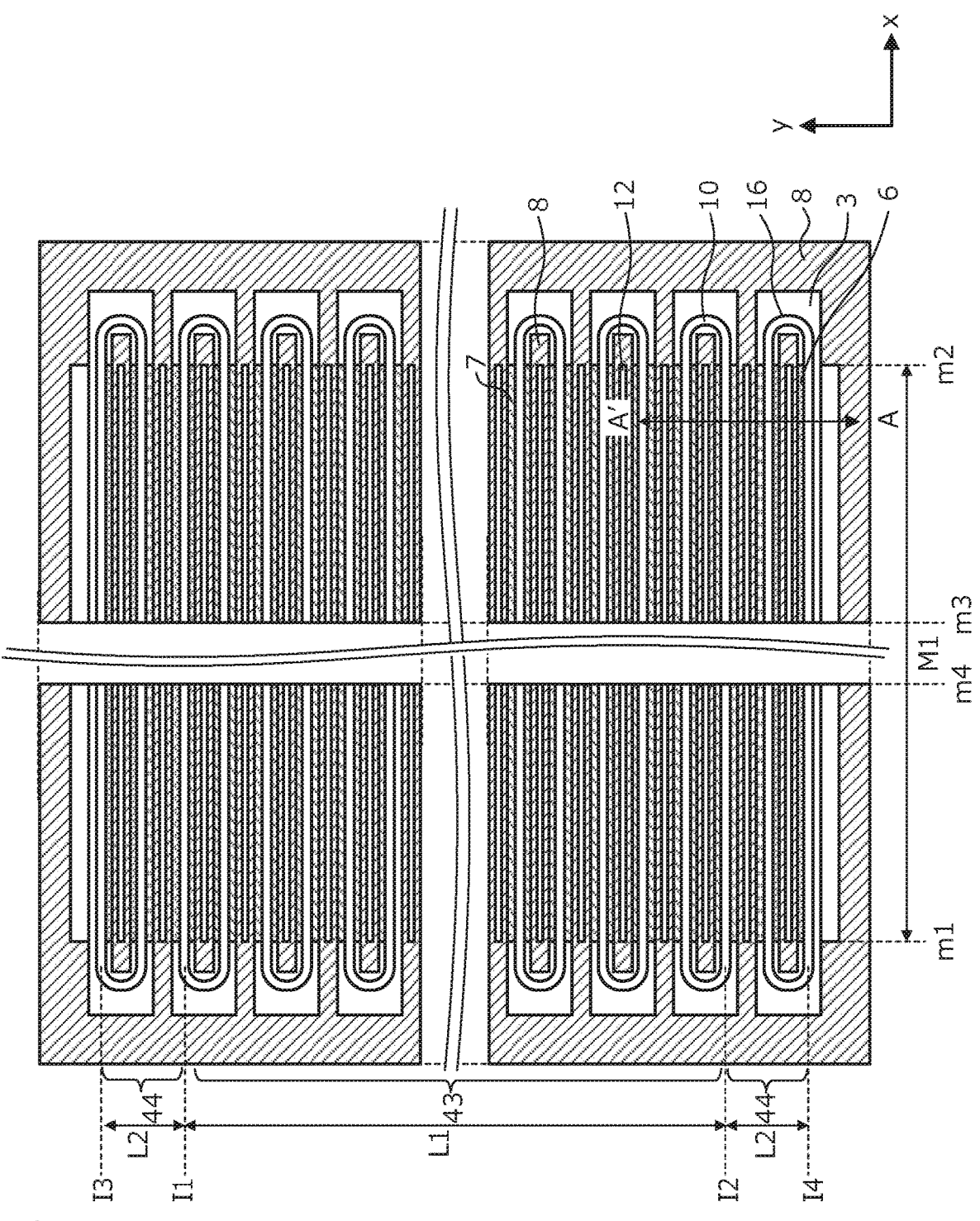
FIG. 4 is a top view depicting a structure of a current sensing portion of the semiconductor device according to the first embodiment.
Figure 5:
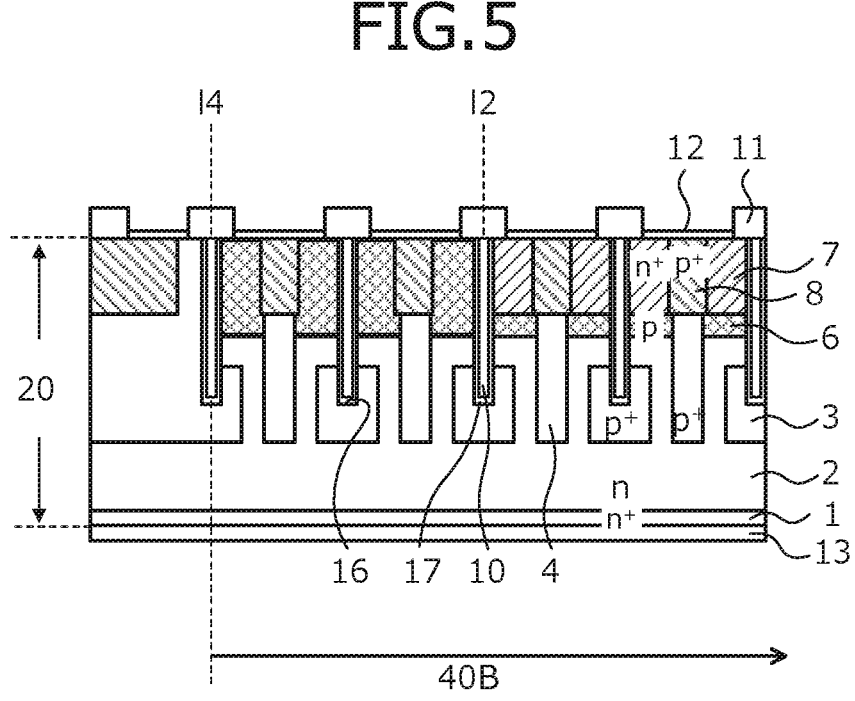
FIG. 5 is a cross-sectional view depicting the structure along cutting line A-A' in FIG. 4, which depicts the structure of the semiconductor device according to the first embodiment.

Next, a structure of the current sensing portion 42 of the semiconductor device 50 according to the first embodiment is described. FIG. 4 is a top view depicting the structure of the current sensing portion of the semiconductor device according to the first embodiment. FIG. 5 is a cross-sectional view depicting the structure along cutting line A-A' in FIG. 4, which depicts the structure of the semiconductor device according to the first embodiment. In FIG. 4, the structure of four corners of the current sensing portion 42 are depicted (similarly in FIGS. 6, 8, and 11 described hereinafter).

In the semiconductor device 50 according to the first embodiment, in an active region 40B of the current sensing portion 42, a MOS structure portion (first cell region) 43 and non-MOS structure portions (second cell regions) 44 are provided. While a structure of the MOS structure portion 43 is the same as the structure of the active region 40 of the main semiconductor device 46, a structure of the non-MOS structure portions 44 is different from the structure of the active region 40 of the main semiconductor device 46. Here, the active region 40B of the current sensing portion 42 is a region between an outermost two of the trenches 16 closest to the edge termination region 41 in a direction (direction of the y-axis) orthogonal to the longitudinal direction of the trenches 16, that is, a region that is from first ends to second ends of the $n^+$-type source regions 7 in the longitudinal direction (direction of the x-axis) of the trenches 16. In other words, in FIG. 4, the active region 40B of the current sensing portion 42 is a region bordered by lines l3 and l4 in the direction of the y-axis and lines m1 and m2 in the x-direction. In FIG. 4, in the structure of the active region 40B of the current sensing portion 42, a region bordered by lines l1 and l2 in the direction of the y-axis and lines m1 and m2 in the x-direction is the MOS structure portion 43. A region bordered by lines l1 and l3 in the direction of the y-axis and lines m1 and m2 in the x-direction and a region bordered by lines l2 and l4 and lines m1 and m2 in the direction of the x-axis are the non-MOS structure portions 44.

As described hereinafter, the non-MOS structure portions 44 have a function for protecting the MOS structure portion 43 from current inadvertently resulting from the main semiconductor device 46. Thus, the non-MOS structure portions 44 may preferably have a predetermined area or greater and are implemented by a function of the current sensing portion 42. The MOS structure portion 43 has to have a predetermined area. For example, an amount of the area of the non-MOS structure portions 44 may be preferably in a range of 10% to 40% and more preferably may be between 15% and 25% of an amount of a combined area (area of the active region of the current sensing portion 42) of the non-MOS structure portions 44 and the MOS structure portion 43. Thus, assuming, in the y-direction, a distance from line l1 to line l3 is "L2", a distance from line l1 to line l2 is "L1", a distance from line l2 to line l4 is "L2", and in the x-direction, a distance from line m1 to line m2 is "M1", thus, the combined area of the non-MOS structure portions 44 and the MOS structure portion 43 is $(L1+2\times L2)\times M1$ and the area of the non-MOS structure portions 44 is $2\times L2\times M1$. Thus, preferably, in the first embodiment, $0.1 \leq 2\times L2\times M1/\{(L1+2\times L2)\times M1\} \leq 0.4$ may satisfied.

Further, in the first embodiment, as depicted in FIGS. 4 and 5, in the region bordered by lines l1 and l3 and the non-MOS structure portion 44 bordered by lines l2 and l4, at the sidewalls of the trenches 16, the p-type base layer 6 is provided and the $n^+$-type source regions 7 are not provided. In this manner, MOS structure is not provided and thus, in the non-MOS structure portions 44, even in the on-state, no channel is formed and in the on-state no current flows. On the other hand, built-in diodes configured by pn junctions between the first and second $p^+$-type base regions 3, 4, the p-type base layer 6, the $p^+$-type contact regions 8, and the n-type silicon carbide epitaxial layer 2 are formed. Thus, in the main semiconductor device 46, even when the built-in diodes configured by the pn junctions between the first and second $p^+$-type base regions 3, 4, the p-type base layer 6, the $p^+$-type contact regions 8, and the n-type silicon carbide epitaxial layer 2 conduct and current inadvertently resulting from the built-in diodes due to dv/dt concentrates at the non-MOS structure portions 44 of the current sensing portion 42, the current does not reach the MOS structure portion 43, and destruction of the active region 40B of the current sensing portion 42 may be prevented.

Further, in Japanese Laid-Open Patent Publication No. 2022-042526, a periphery of the current sensing MOSFET is surrounded by a SBD and a periphery thereof is further surrounded by a pn diode, whereby destruction of the current sensing MOSFET is prevented. Nonetheless, the current sensing MOSFET and the pn diode are apart from each other and thus, in Japanese Laid-Open Patent Publication No. 2022-042526, current inadvertently resulting from the built-in diode may slip through the pn diode. On the other hand, in the first embodiment of the present invention, the non-MOS structure portions 44, which function as diodes, are adjacent to the MOS structure portion 43. Thus, without current inadvertently resulting from the built-in diode and slipping through the non-MOS structure portions 44, the active region 40B of the current sensing portion 42 may be assuredly protected as compared to that in Japanese Laid-Open Patent Publication No. 2022-042526. Furthermore, between the MOS structure portion 43 and the non-MOS structure portions 44 is free of any gaps and thus, the overall surface area of the current sensing portion 42 may be reduced.

Here, in FIG. 4, the non-MOS structure portions 44 are provided in a region surrounded by lines l1, l3, m1, m2 and a region surrounded by lines l2, l4, m1, m2 and are disposed on two opposite sides. Nonetheless, configuration is not limited hereto and the non-MOS structure portions 44 may be provided on two sides opposite to each other in a direction (the y-direction) dividing the trenches 16 horizontally or may be provided only at four corners. In an instance in which the non-MOS structure portions 44 are provided only at the four corners, the non-MOS structure portions 44 are provided in a region surrounded by lines l1, l3, m1, m4; a region surrounded by lines l1, l3, m3, m2; a region surrounded by lines l2, l4, m1, m4; and a region surrounded by lines l2, l4, m3, m2. Further, the non-MOS structure portions 44 may be provided so as to surround the MOS structure portion 43. Thus, the active region of the current sensing portion 42 may be protected more assuredly. In any instance, preferably, the amount of the area of the non-MOS structure portions 44 of the combined area of the non-MOS structure portions 44 and the MOS structure portion 43 may be a value described above.

Further, in the edge termination region 41 of the current sensing portion 45 and of the main semiconductor device 46, the first $p^+$-type base regions 3 are provided in the n-type silicon carbide epitaxial layer 2 while the $p^+$-type contact regions 8 are provided in the first $p^+$-type base regions 3, at the surfaces thereof, and the edge termination region 41 of the current sensing portion 45 and of the main semiconductor device 46 is free of the MOS structure configured by the trenches 16, the $n^+$-type source regions 7, the gate insulating films 17, and the gate electrodes 10.

As described above, according to the first embodiment, in the active region of the current sensing portion, the non-MOS structure portion that is structured differently from the active region of the main semiconductor device is provided. In the first embodiment, the p-type base layer is provided in the non-MOS structure portion and the non-MOS structure portion is free of $n^+$-type source regions at the sidewalls of the trenches. Thus, in the main semiconductor device, even when the built-in diode conducts and current inadvertently resulting from the built-in diode due to dv/dt concentrates in the non-MOS structure portion of the current sensing portion, the current does not reach the MOS structure portion and destruction of the active region of the current sensing portion is prevented. Accordingly, destruction resistance capability of the active region of the current sensing portion may be improved.

Figure 6:
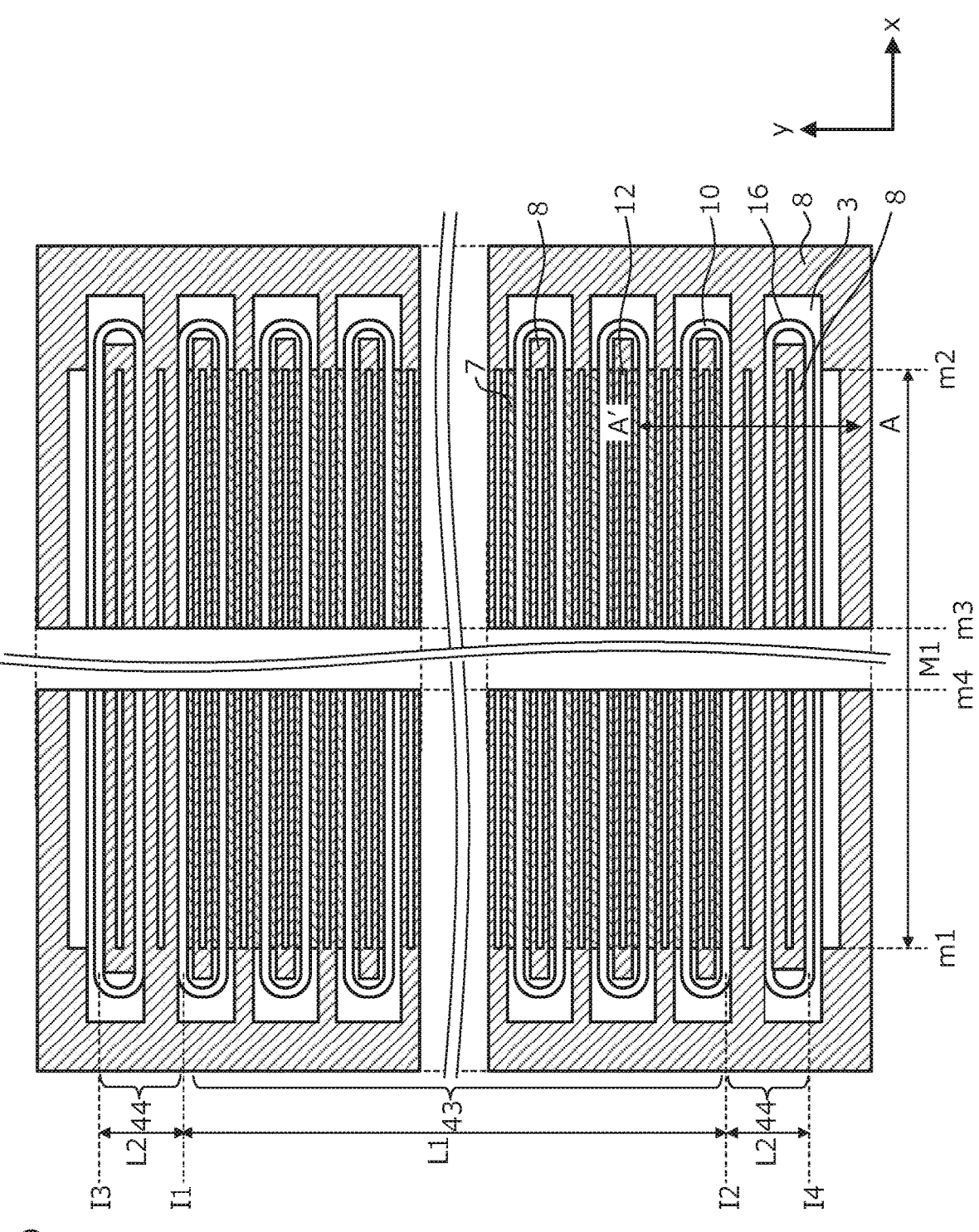
FIG. 6 is a top view depicting a structure of the current sensing portion of the semiconductor device according to a second embodiment.
Figure 7:
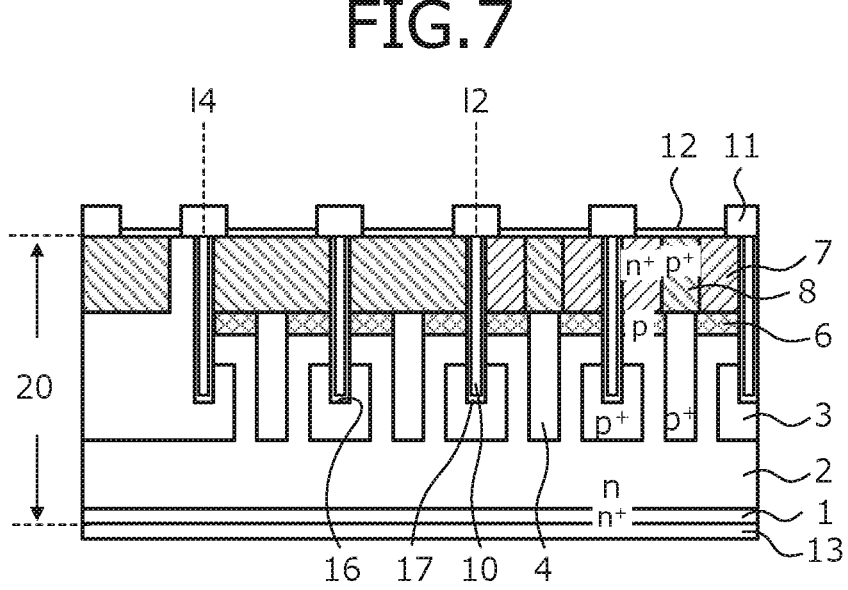
FIG. 7 is a cross-sectional view along cutting line A-A' in FIG. 6, which depicts the structure of the semiconductor device according to the second embodiment.

Next, a semiconductor device according to a second embodiment is described. A top view of a semiconductor device 50 according to the second embodiment and the structure of the main semiconductor device 46 are similar to those of the semiconductor device 50 according to the first embodiment and thus, are not depicted (refer to FIGS. 1 to 3). FIG. 6 is a top view depicting the structure of the current sensing portion of the semiconductor device according to the second embodiment. FIG. 7 is a cross-sectional view along cutting line A-A' in FIG. 6, which depicts the structure of the semiconductor device according to the second embodiment.

Similarly to the first embodiment, in the semiconductor device 50 according to the second embodiment as well, the MOS structure portion 43 and the non-MOS structure portions 44 are provided in the active region 40B of the current sensing portion 42 and while the structure of the MOS structure portion 43 is the same as the structure of the active region 40 of the main semiconductor device 46, the structure of the non-MOS structure portions 44 differs from the structure of the active region 40 of the main semiconductor device 46. In particular, the structure differs from that in the first embodiment in that in the non-MOS structure portions 44, the $p^+$-type contact regions 8 are provided spanning an entire area of the mesa regions between adjacent ones of the trenches 16.

In FIG. 6, in the structure of the active region 40B of the current sensing portion 42, a region bordered by lines l1 and l2 in the direction of the y-axis and a region bordered by m1 and m2 in the x-direction are the MOS structure portion 43. A region bordered by lines l1 and l3 in the direction of the y-axis and lines m1 and m2 in the x-direction and a region bordered by lines l2 and l4 and in the x-direction, by lines m1 and m2 are the non-MOS structure portions 44. Similarly to the first embodiment, in the second embodiment as well, preferably, $0.1 \leq 2 \times L2 \times M1/\{(L1+2 \times L2) \times M1\} \leq 0.4$ may be satisfied. Further, in the second embodiment, the non-MOS structure portions 44 may be provided at only the four corners.

Further, in the second embodiment, as depicted in FIGS. 6 and 7, in a region bordered by lines l1 and l3 and the non-MOS structure portion 44 bordered by lines l2 and l4, the $p^+$-type contact regions 8 are provided in an entire area of the mesa regions between the trenches 16 that are adjacent to one another and the sidewalls of the trenches 16 are free of the $n^+$-type source regions 7. In this manner, MOS structure is not provided and thus, in the non-MOS structure portions 44, no channels are formed even in the on-state and no current flows in the on-state. On the other hand, the built-in diodes configured by the pn junctions between the first and second p$^+$-type base regions 3, 4, the p-type base layer 6, the p$^+$-type contact regions 8, and the n-type silicon carbide epitaxial layer 2 are formed. Thus, in the second embodiment as well, destruction of the active region of the current sensing portion 42 may be prevented similarly to the first embodiment.

As described above, according to the second embodiment, the non-MOS structure portion having a structure different from the structure of the active region of the main semiconductor device is provided in the active region of the current sensing portion. In the second embodiment, in the non-MOS structure portion, the p$^+$-type contact regions are provided and n$^+$-type source regions are not provided at the sidewalls of the trenches. Thus, effects similar to those of the first embodiment are obtained.

Figure 8:
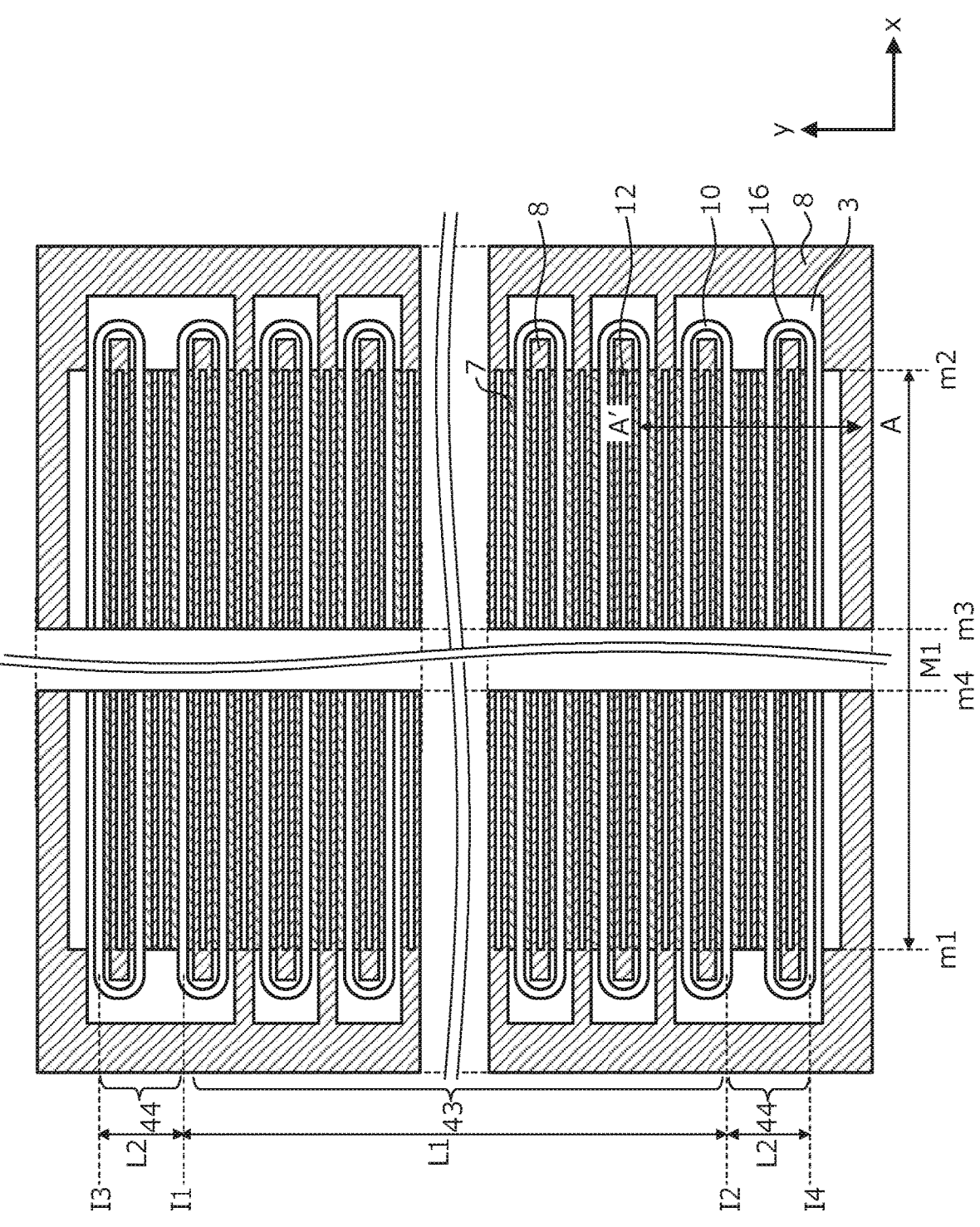
FIG. 8 is a top view depicting a structure of the current sensing portion of the semiconductor device according to a third embodiment.
Figures 9, 10:
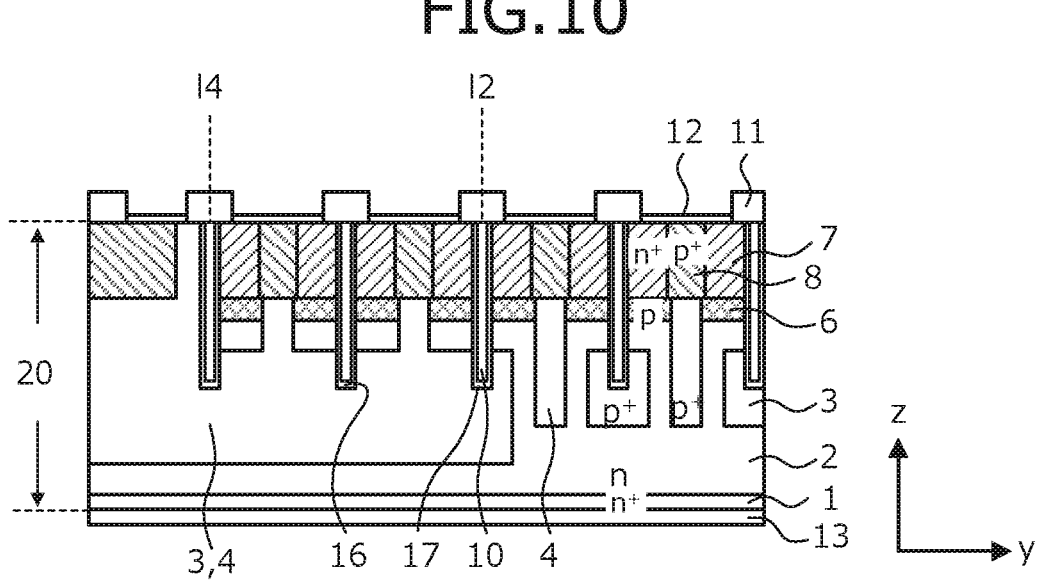
FIG. 9 is a cross-sectional view along cutting line A-A' in FIG. 8, which depicts the structure of the semiconductor device according to the third embodiment.
FIG. 10 is a cross-sectional view along cutting line A-A' in FIG. 8, which depicts a structure of the semiconductor device according to a fourth embodiment.

Next, a semiconductor device according to a third embodiment is described. A top view of the semiconductor device 50 according to the third embodiment and the structure of the main semiconductor device 46 thereof are the same as those of the semiconductor device 50 according to the first embodiment and thus, are not depicted (refer to FIGS. 1 to 3). FIG. 8 is a top view depicting the structure of the current sensing portion of the semiconductor device according to the third embodiment. FIG. 9 is a cross-sectional view along cutting line A-A' in FIG. 8, which depicts the structure of the semiconductor device according to the third embodiment.

Similarly to the first embodiment, in the semiconductor device 50 according to the third embodiment as well, the MOS structure portion 43 and the non-MOS structure portions 44 are provided in the active region 40B of the current sensing portion 42 and the structure of the MOS structure portion 43 is the same as the structure of the active region 40 of the main semiconductor device 46 and the structure of the non-MOS structure portions 44 differs from the structure of the active region 40 of the main semiconductor device 46. In particular, in the non-MOS structure portions 44, configuration is such that between the first p$^+$-type base regions 3 and the second p$^+$-type base regions 4 is free of the n-type silicon carbide epitaxial layer 2, whereby no current flows between a source and drain.

In FIG. 8, in the structure of the active region 40B of the current sensing portion 42, a region bordered by lines 11 and 12 in the direction of the y-axis is the MOS structure portion 43. A region bordered by lines 11 and 13 in the direction of the y-axis and a region bordered by lines 12 and 14 are the non-MOS structure portions 44. Similarly to the first embodiment, in the third embodiment as well, preferably, 0.1≤2×L2×M1/{(L1+2×L2)×M1}≤0.4 may be satisfied. In the third embodiment as well, the non-MOS structure portions 44 may be provided only at the four corners.

Further, in the third embodiment, as depicted in FIGS. 8 and 9, in a region bordered by lines 11 and 13 and in the non-MOS structure portion 44 bordered by line 12 and 14, the first p$^+$-type base regions 3 and the second p$^+$-type base regions 4 are connected to one another and in a direction in which the trenches 16 are arranged (the direction of the y-axis), and between the first p$^+$-type base regions 3 and the second p$^+$-type base regions 4 is free of the n-type silicon carbide epitaxial layer 2. Thus, portions of the n-type silicon carbide epitaxial layer 2 facing the n-type source regions 7 in the depth direction are separated by the p-type base layer 6, the first p$^+$-type base regions 3, and the second p$^+$-type base regions 4. In this manner, the n-type silicon carbide epitaxial layer 2 is separated and thus, in the non-MOS structure portions 44, even when a channel is formed in the on-state, no current flows between the source and drain. On the other hand, the built-in diodes configured by the pn junctions between the first and second p$^+$-type regions 3, 4, the p-type base layer 6, the p$^+$-type contact regions 8, and the n-type silicon carbide epitaxial layer 2 are formed. Thus, similarly to the first embodiment, in the third embodiment as well, destruction of the active region 40B of the current sensing portion 42 may be prevented.

As described above, according to the third embodiment, the non-MOS structure portion having a structure different from the structure of the active region of the main semiconductor device is provided in the active region of the current sensing portion. In the third embodiment, the first p$^+$-type base regions and the second p$^+$-type base regions are connected in the non-MOS structure portion. Thus, effects similar to those of the first embodiment are obtained.

Next, a semiconductor device according to a fourth embodiment is described. A top view of the semiconductor device 50 according to the fourth embodiment and the structure of the main semiconductor device 46 thereof are the same as those of the semiconductor device 50 according to the first embodiment and thus, are not depicted (refer to FIGS. 1 to 3). Further, a top view depicting a structure of the current sensing portion of the semiconductor device according to the fourth embodiment is similar to that depicting the structure of the current sensing portion 42 of the third embodiment and thus, is not depicted (refer to FIG. 8). FIG. 10 is a cross-sectional view along cutting line A-A' in FIG. 8, which depicts the structure of the semiconductor device according to the fourth embodiment. The fourth embodiment differs from the third embodiment in that lower surfaces of the first and second p$^+$-type base regions 3, 4 are deeper in the non-MOS structure portions 44 than in the MOS structure portion 43.

Similarly to the first embodiment, in the semiconductor device 50 according to the fourth embodiment as well, the MOS structure portion 43 and the non-MOS structure portions 44 are provided in the active region 40B of the current sensing portion 42 and the structure of the MOS structure portion 43 is similar to the structure of the active region 40 of the main semiconductor device 46; however, the structure of the non-MOS structure portions 44 differs from the structure of the active region 40 of the main semiconductor device 46. Similarly to the first embodiment, in the fourth embodiment as well, preferably, may be satisfied. In the fourth embodiment as well, the non-MOS structure portions 44 may be provided only at the four corners.

Further, in the fourth embodiment, as depicted in FIGS. 8 and 10, in a region bordered by lines 11 and 13 and in the non-MOS structure portion 44 bordered by 12 and 14, the first p$^+$-type base regions 3 and the second p$^+$-type base regions 4 are connected to one another, in the direction of the y-axis, and between the first p$^+$-type base regions 3 and the second p$^+$-type base regions 4 is free of the n-type silicon carbide epitaxial layer 2. Moreover, in the fourth embodiment, the first p$^+$-type base regions 3 and the second p$^+$-type base regions 4 of the non-MOS structure portions 44 are deeper than the first p$^+$-type base regions 3 and the second p$^+$-type base regions 4 of the MOS structure portion 43. Further, instead of increasing the depth, in the fourth embodiment, impurity concentrations of the first p$^+$-type base regions 3 and the second p$^+$-type base regions 4 of the non-MOS structure portions 44 may be higher than impurity concentrations of the first p$^+$-type base regions 3 and the second p$^+$-type base regions 4 of the MOS structure portion 43.

Thus, portions of the n-type silicon carbide epitaxial layer 2 facing the n$^+$-type source regions 7 in the depth direction are separated by the p-type base layer 6, the first p$^+$-type base regions 3, and the second p$^+$-type base regions 4. In this manner, the n-type silicon carbide epitaxial layer 2 is separated and thus, in the non-MOS structure portions 44, even when a channel is formed in the on-state, no current flows between the source and drain. On the other hand, the built-in diodes configured by the pn junctions between the p-type base layer 6, the p$^+$-type contact regions 8, and the n-type silicon carbide epitaxial layer 2 are formed. Thus, similarly to the first embodiment, in the fourth embodiment as well, destruction of the active region 40B of the current sensing portion 42 may be prevented.

As described above, according to the fourth embodiment, the non-MOS structure portion having a structure different from the structure of the active region of the main semiconductor device is provided in the active region of the current sensing portion. In the fourth embodiment, the first p$^+$-type base regions and the second p$^+$-type base regions are connected in the non-MOS structure portion, the first p$^+$-type base regions and the second p$^+$-type base regions of the non-MOS structure portion are deeper than the first p$^+$-type base regions and the second p$^+$-type base regions of the MOS structure portion. Thus, effects similar to those of the first embodiment are obtained.

Figure 11:
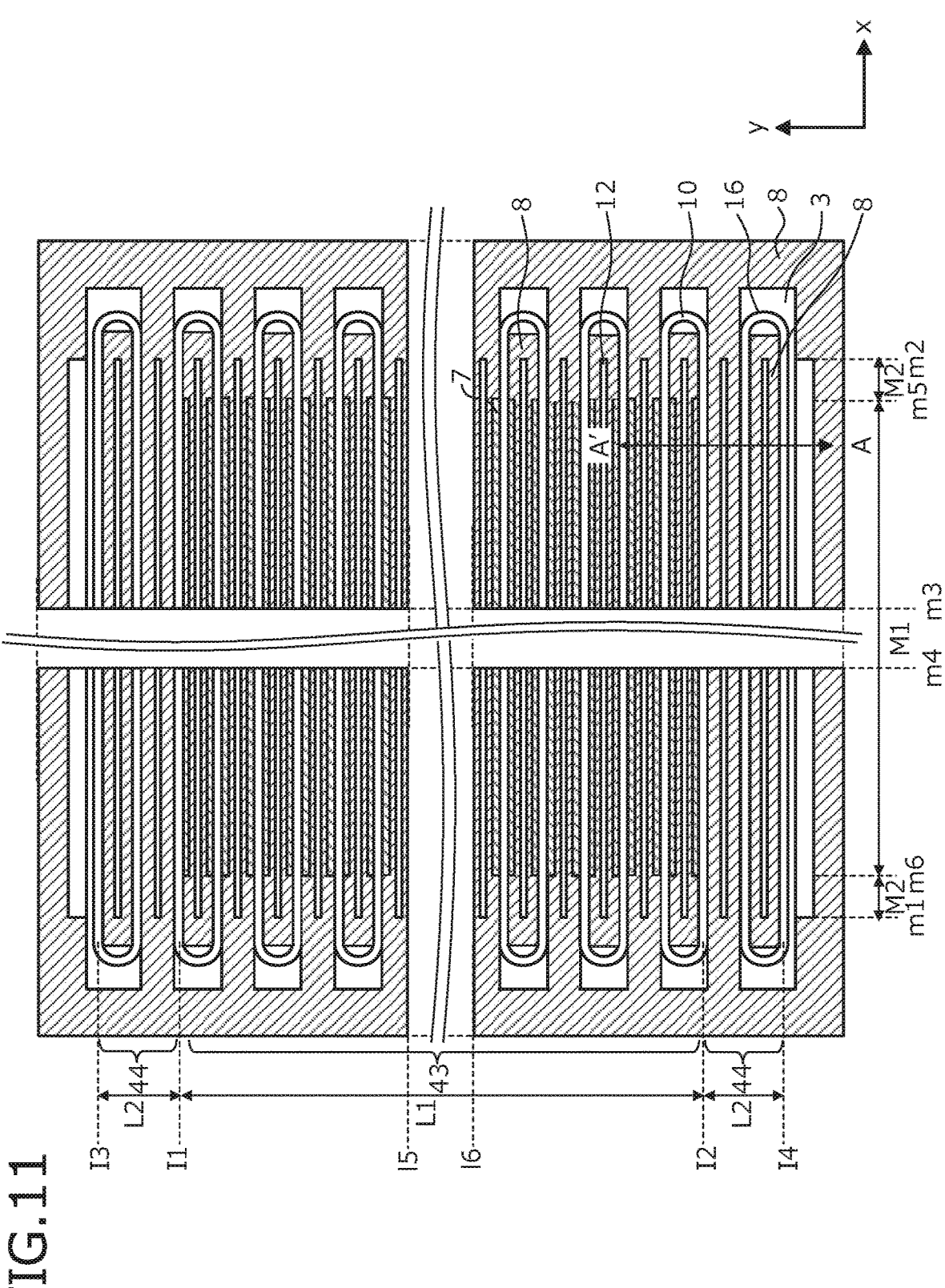
FIG. 11 is a top view depicting a structure of the current sensing portion of the semiconductor device according to a fifth embodiment.
Figure 12:
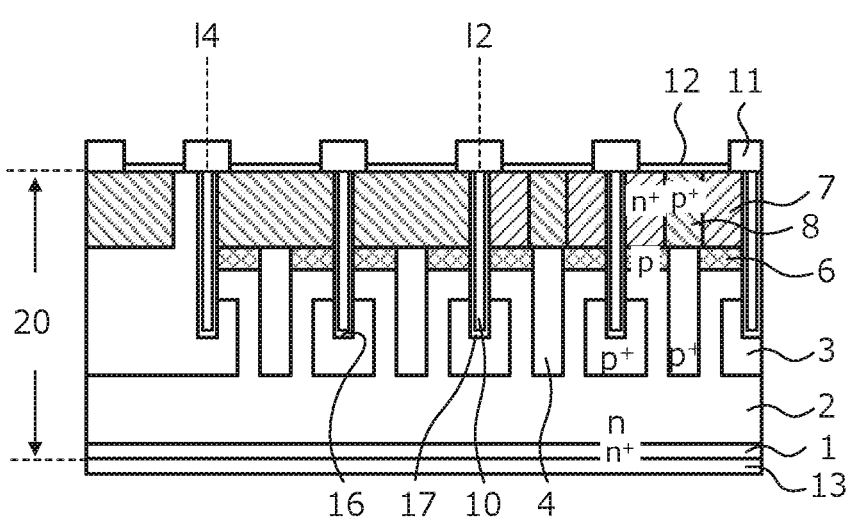
FIG. 12 is a cross-sectional view along cutting line A-A' in FIG. 11, which depicts the structure of the semiconductor device according to the fifth embodiment.
Figure 13:
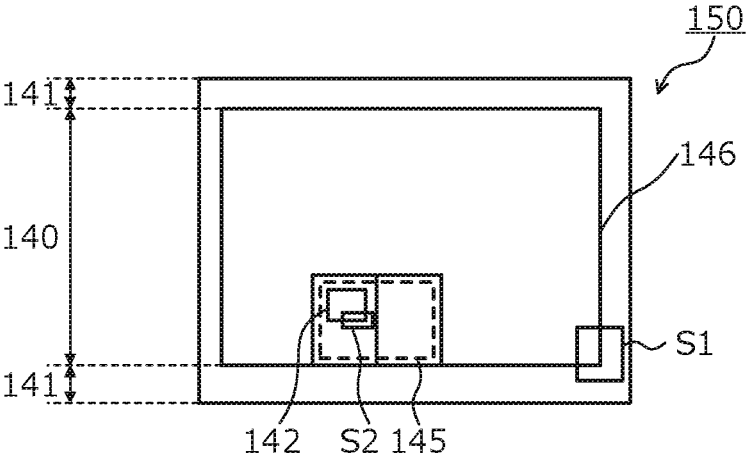
FIG. 13 is a top view depicting a structure of a conventional semiconductor device.

Next, a semiconductor device according to a fifth embodiment is described. A top view of the semiconductor device 50 according to the fifth embodiment and the structure of the main semiconductor device 46 thereof are the same as those of the semiconductor device 50 according to the first embodiment and thus, are not depicted (refer to FIGS. 1 to 3). FIG. 11 is a top view depicting the structure of the current sensing portion of the semiconductor device according to the fifth embodiment. FIG. 12 is a cross-sectional view along cutting line A-A' in FIG. 11, which depicts the structure of the semiconductor device according to the fifth embodiment.

Similarly to the first embodiment, in the semiconductor device 50 according to the fifth embodiment as well, the MOS structure portion 43 and the non-MOS structure portions 44 are provided in the active region 40B of the current sensing portion 42. While the structure of the MOS structure portion 43 is the same as the structure of the active region 40 of the main semiconductor device 46, the structure of the non-MOS structure portions 44 differs from the structure of the active region 40 of the main semiconductor device 46. In particular, in the fifth embodiment, similarly to the second embodiment, in the non-MOS structure portions 44, the p$^+$-type contact regions 8 are provided spanning an entire area of the mesa regions between the trenches 16 that are adjacent to one another and unlike in the first to fourth embodiments, the non-MOS structure portions 44 are disposed so as to surround the MOS structure portion 43.

In the fifth embodiment, in the structure of the active region 40B of the current sensing portion 42, a region bordered by lines l1 and l2 in the direction of the y-axis and by lines m5 and m6 in the direction of the x-axis is the MOS structure portion 43. On the other hand, in the direction of the y-axis, a region bordered by lines l1 and l3 and a region bordered by lines l2 and l4, and in the direction of the x-axis, a region bordered by lines m1 and m6 and a region bordered by lines m2 and m5 are the non-MOS structure portions 44. Thus, the distance from line l1 to line l3 is assumed as "L2", the distance from line l1 to l2 is assumed as "L1", the distance from line l2 to line l4 is assumed as "L2", a distance from line m1 to line m6 is assumed as "M2", a distance from line m5 to line m6 is assumed as "M1", and a distance from line m2 to line m5 is assumed as "M2". In this instance, the combined area (area of the active region 40B of the current sensing portion 42) of the non-MOS structure portions 44 and the MOS structure portion 43 is (L1+2×L2)×(M1+2×M2) and the area of the non-MOS structure portions 44 is 2×L2×(M2+M1)+2×M2×(L2+L1). Thus, in the fifth embodiment, similarly to the first embodiment, preferably, 0.1≤{2×L2×(M2+M1)+2×M2×(L2+L1)}/{(L1+2×L2)×(M1+2×M2)}≤0.4 may be satisfied.

Further, in the fifth embodiment, as depicted in FIGS. 11 and 12, in the area bordered by lines l1 and l3 and in the non-MOS structure portion 44 bordered by lines l2 and l4, the n$^+$-type source regions 7 are not provided at the sidewalls of the trenches 16 and the p$^+$-type contact regions 8 are provided spanning an entire area of the mesa regions between the trenches 16 that are adjacent to one another. Moreover, in the region bordered by lines l1 and l2, the n$^+$-type source regions 7 are provided in the MOS structure portion 43 corresponding to that from lines m5 to m6; and the non-MOS structure portions 44 corresponding to that from lines m1 to m6 and that from lines m2 to m5 are free of the n$^+$-type source regions 7. In this manner, the non-MOS structure portions 44 are free of the n$^+$-type source regions 7 and thus, even in the on-state, no channel is formed and no current flows in the on-state. On the other hand, the built-in diodes configured by the pn junctions between the first and second p$^+$-type base regions 3, 4, the p-type base layer 6, the p$^+$-type contact regions 8, and the n-type silicon carbide epitaxial layer 2 are formed. Thus, in the main semiconductor device 46, the built-in diodes configured by the pn junctions between the first and second p$^+$-type base regions 3, 4, the p-type base layer 6, the p$^+$-type contact regions 8, and the n-type silicon carbide epitaxial layer 2 conduct and even when current inadvertently resulting from the built-in diodes due to dv/dt concentrates in the non-MOS structure portions 44 of the current sensing portion 42, the current does not reach the MOS structure portion 43 and destruction of the active region 40B of the current sensing portion 42 may be prevented.

Furthermore, in the fifth embodiment, not only at ends (region bordered by lines l1 and l3 and region bordered by lines l2 and l4) in the direction of the y-axis but also at ends (region bordered by lines m1 and m6 and region bordered by lines m2 and m5) in the direction of the x-axis, the non-MOS structure portions 44 are provided and the non-MOS structure portions 44 surround the 4 sides of the MOS structure portion 43. Thus, as compared to the first to fourth embodiments in which the non-MOS structure portions 44 are provided only at the ends in the direction of the y-axis, current that inadvertently results from the built-in diodes is further inhibited from reaching the MOS structure portion 43 of the current sensing portion 42 and destruction of the active region 40B of the current sensing portion 42 may be further prevented.

Further, in the fifth embodiment, similarly to the first embodiment, the structure of the non-MOS structure portions 44 is such that the sidewalls of the trenches 16 are free of the n$^+$-type source regions 7 and the p-type base layer 6 is provided. Furthermore, similarly to the third embodiment, the structure of the non-MOS structure portions 44 may be such that the first p$^+$-type base regions 3 and the second p$^+$-type base regions 4 are connected to one another. Similarly to the fourth embodiment, the structure of the non-MOS structure portions 44 may be such that the first p$^+$-type base regions 3 and the second p$^+$-type base regions 4 are connected to one another and the first p$^+$-type base regions 3 and the second p$^+$-type base regions 4 of the non-MOS structure portions 44 are deeper than the first p$^+$-type base regions 3 and the second p$^+$-type base regions 4 of the MOS structure portion 43. Further, the structure of the non-MOS structure portions 44 may be changed by the ends in the direction of the x-axis and the ends in the direction of the y-axis when no current flows in the on-state.

Here, in FIG. 11, while the non-MOS structure portions 44 are provided in a region bordered by lines l1, l3, m1, m2, a region bordered by lines l2, l4, m1, m2, a region bordered by lines l3, l4, m1, m6, and a region bordered by lines l3, l4, m2, m5, the non-MOS structure portions 44 may be provided only at the four corners. In this instance, the non-MOS structure portions 44 are a region bordered by lines l1, l3, m1, m4, a region bordered by lines l1, l3, m2, m3, a region bordered by lines l2, l4, m1, m4, a region bordered by lines l2, l4, m2, m3, a region bordered by lines l3, l5, m1, m6, a region bordered by lines l6, l4, m1, m6, a region bordered by lines l3, l5, m2, m5, and a region bordered by lines l6, l4, m2, m5. In this instance as well, a percentage of the amount of the area of the non-MOS structure portions 44 of the amount of the combined area of the non-MOS structure portions 44 and the MOS structure portion 43 may be, preferably, a value described above.

As described above, according to the fifth embodiment, the non-MOS structure portion having a structure different from the structure of the active region of the main semiconductor device is provided in the active region of the current sensing portion. In the fifth embodiment, the sidewalls of the trenches are free of the $n^+$-type source regions and the non-MOS structure portions in which the $p^+$-type contact regions are provided surround the MOS structure portion. Thus, as compared to the first to fourth embodiments in which the non-MOS structure portions are provided only at the ends in the direction of the y-axis, current inadvertently due to the built-in diodes is inhibited from reaching the MOS structure portion of the current sensing portion and destruction of the active region of the current sensing portion may be further prevented. Accordingly, as compared to the first to fourth embodiments, destruction resistance capability of the active region of the current sensing portion may be further improved.

In the foregoing, the present invention may be variously changed within a range not departing from the spirit of the invention and in the embodiments described above, for example, dimensions, impurity concentrations, etc. of regions may be variously set according to necessary specifications. Further, in the embodiments described above, other than silicon carbide (SiC), a semiconductor such as silicon (Si), gallium nitride (GaN) may be used as a semiconductor. Further, in the embodiments described above, while a trench-type MOSFET having trenches in a striped pattern is described as an example, wide application is possible to semiconductor devices such as trench-type MOSFETs having trenches in a lattice-like pattern, planar-type MOSFETs, and the like.

According to the invention described above, in the active region of the current sensing portion, the MOS structure portion (first cell region) having the same structure as the structure of the active region of the main semiconductor device, and the non-MOS structure portions (second cell regions) having a structure that is different from the structure of the active region of the main semiconductor device are provided. Thus, when the built-in diode in the main semiconductor device transitions from a forward conducting state to reverse recovery operation, even when current advertently resulting from the built-in diode due to dv/dt concentrates in the non-MOS structure portion of the current sensing portion, the current does not reach the MOS structure portion and destruction of the active region of the current sensing portion may be prevented.

The semiconductor device according to the present invention achieves an effect in that destruction resistance capability of the active region of the current sensing portion may be improved.

As described above, the semiconductor device according to the present invention is useful for power semiconductor devices used in power converting equipment such as inverters, power source devices of various types of industrial machines, ignitors of automobiles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a main semiconductor region through which a main current flows during an on-state of the device, the main semiconductor region being configured by a first structure; and
a current detecting region having an active region through which another current different from the main current flows during the on-state, the current detecting region being configured by a second structure, wherein each of the first structure and the second structure has:
a semiconductor substrate of a first conductivity type, the semiconductor substrate having a first main surface and a second main surface that are opposite to each other;
a first semiconductor layer of the first conductivity type, provided at the first main surface of the semiconductor substrate, the first semiconductor layer having an impurity concentration that is lower than an impurity concentration of the semiconductor substrate, the first semiconductor layer having a first surface and a second surface that are opposite to each other, the second surface facing the semiconductor substrate;
a second semiconductor layer of a second conductivity type, provided at the first surface of the first semiconductor layer, the second semiconductor layer having a first surface and a second surface that are opposite to each other, the second surface facing the semiconductor substrate;
a plurality of first semiconductor regions of the second conductivity type, selectively provided in the second semiconductor layer, at the first surface of the second semiconductor layer, each of the plurality of first semiconductor regions having an impurity concentration that is higher than an impurity concentration of the second semiconductor layer;
a plurality of trenches extending through the second semiconductor layer and reaching the first semiconductor layer;
a plurality of gate electrodes respectively provided in the plurality of trenches via respective ones of a plurality of insulating films;
a plurality of first high-concentration regions of the second conductivity type, provided in the first semiconductor layer and facing respective ones of the plurality of trenches in a depth direction of the device;
a plurality of second high-concentration regions of the second conductivity type, each provided between an adjacent two of the plurality of trenches in the first semiconductor layer and the second semiconductor layer and connected to the plurality of first semiconductor regions;

a plurality of first electrodes electrically connected to the second semiconductor layer; and a second electrode provided at the second main surface of the semiconductor substrate, the first structure further has a plurality of second semiconductor regions of the first conductivity type selectively provided in the second semiconductor layer, at the first surface of the second semiconductor layer, the plurality of trenches further respectively extending through the plurality of second semiconductor regions, each of the plurality of first electrodes being further electrically connected to a corresponding one of the plurality of second semiconductor regions, and the active region of the current detecting region has four corners, and includes:

a first cell region operating as a transistor, and a plurality of second cell regions provided at respective ones of the four corners of the active region, and each operating as only a diode and not the transistor.

2. The semiconductor device according to claim 1, wherein the second structure of the first cell region of the active region further has an other plurality of second semiconductor regions of the first conductivity type, and the second structure of the plurality of second cell regions is free of the other plurality of second semiconductor regions.

3. The semiconductor device according to claim 2, wherein in the plurality of second cell regions, each of the plurality of first semiconductor regions is provided between the adjacent two of the plurality of trenches.

4. The semiconductor device according to claim 1, wherein in the plurality of second cell regions, the plurality of first high-concentration regions and the plurality of second high-concentration regions are connected to one another, and an area between the plurality of first high-concentration regions and the plurality of second high-concentration regions is free of the first semiconductor layer.

5. The semiconductor device according to claim 4, wherein a depth of each first high-concentration region and a depth of each second high-concentration region that are provided in each second cell region are greater than a depth of each first high-concentration region and a depth of each second high-concentration region that are provided in the first cell region.

6. The semiconductor device according to claim 4, wherein an impurity concentration of each first high-concentration region and an impurity concentration of each second high-concentration region that are provided in each second cell region are higher than an impurity concentration of each first high-concentration region and an impurity concentration of each second high-concentration region that are provided in the first cell region.

7. The semiconductor device according to claim 1, wherein the plurality of trenches forms a striped pattern, and in each of the plurality of second cell regions, a length of each of the plurality of second semiconductor regions in a longitudinal direction of the plurality of trenches is less than a length of each of the plurality of first semiconductor regions, and an area between the adjacent two of the plurality of trenches is free of the plurality of second semiconductor regions and has one of the plurality of first high-concentration regions.

8. The semiconductor device according to claim 1, wherein an amount of an area of the plurality of second cell regions is in a range of 10% to 40% of an amount of a combined area of the first cell region and the plurality of second cell regions.

9. The semiconductor device according to claim 1, wherein the plurality of second cell regions are provided at respective ones of two opposite sides of the first cell region.

10. The semiconductor device according to claim 9, wherein the plurality of second cell regions surrounds the first cell region.

* * * * *